(12) United States Patent
Fodor

(10) Patent No.: US 6,230,415 B1
(45) Date of Patent: May 15, 2001

(54) ELECTRIC COMPASS

(76) Inventor: Pedro Fodor, Dorrego 2374, Sarandi (AR)

( * ) Notice: Subject to any disclaimer, the term of this patent is extended or adjusted under 35 U.S.C. 154(b) by 0 days.

(21) Appl. No.: 09/349,013

(22) Filed: Jul. 7, 1999

(30) Foreign Application Priority Data

May 3, 1999 (AR) .......................................... P-990102058

(51) Int. Cl.$^7$ ................................................ G01R 19/00
(52) U.S. Cl. ........................................... 33/300; 324/76.11
(58) Field of Search ................. 33/300, 326; 324/76.11, 324/133

(56) References Cited

U.S. PATENT DOCUMENTS

| | | | | |
|---|---|---|---|---|
| 1,138,690 | * | 5/1915 | Rypinski | 324/76.11 |
| 1,344,388 | * | 6/1920 | Eisenmann | 324/133 |
| 2,808,565 | * | 10/1957 | Zuti et al. | 324/133 |
| 3,441,852 | * | 4/1969 | Hallenbeck | 324/76.11 |

* cited by examiner

Primary Examiner—G. Bradley Bennett
(74) Attorney, Agent, or Firm—Rodman & Rodman

(57) ABSTRACT

An electrical compass for detecting the presence of electrical fields including a box housing a detector needle made of a non-electrical conducting material and having a rotation center rotatably mounted in an upper end of a pin fixed to a bottom portion inside the box.

9 Claims, 2 Drawing Sheets

ELECTRIC COMPASS

BACKGROUND OF THE INVENTION

1. Field of the Invention

The present invention relates to an electric compass, preferably an electrical field detector, and more particularly refers to a detector that is applied as much as in the field of science, industry, as well as in minor, educational and/or domestic experiments, wherein the compass detects electric fields indicating the presence of an electrical field by orienting or aiming a needle in a way similar to a compass for locating and detecting magnetic fields and/or poles.

2. Description of the Prior Art

Up to the present there is no knowledge of the existence of instruments of simple and accurate operation to detect electrical fields. It is only known that, in the electrical and magnetic field, metal detectors are used for the localization of, inlay and/or underground metallic pipes.

Devices for measuring electric current intensity flowing through a conductor, such as the amperometric pliers, are also known. These devices detect magnetic fields generated by said electric current around the conductor, and the equivalent value in the amperes corresponding scale, may be read.

As it is well known, in the proximity of a body electrically charged, attraction forces appears in the presence of electric charges of the opposite sign, which repulsion forces appear for charges having the same sign that the one of the body. The space where the repulsion or attraction forces are generated, is defined as the electric field. Formally it has been established that the direction of the electric field is the one that extends from the positive charges towards the negative charges. If the charges that take place under this electric field are in equilibrium or in balance, said electric field is denominated the electric static field, the features of which, like in the case of moving charges, can be measured in magnitude, sense and direction. The magnitude of the electric field measured in a special point of the region where this field has been generated is defined as electrical potential, which potential not only depends on the amount of accumulated charges by the body, but also by the geometry and distribution of the charges in said body.

Thus, for example, taking two isolated spheres having the same amount of electrostatic charge with equal sign, either positive or negative, with sphere "A" being bigger than sphere "B", the electrical potential individually measured from a distance "d" in a point P, will be larger in the case of the small sphere "B". This is because the repulsion forces between charges of same signs cause said charges to be homogeneously distributed on the entire sphere surface. Therefore, the density of the charges distributed in the surface of these spheres, and observed in each case at equal distance from point "P", is greater than the density of charge on sphere A.

In accordance to the foregoing, in the bodies of irregular surface, the density of charges is less in flat zones than in curved zones and the greater amounts of charges by surface unit is found in the end or vertex of the parts that defines acute angles, this effect being known as point effect, where, consequently, the electrostatic potential is larger.

It is also to be mentioned that the electric charge accumulation takes place as much as in electrically conducting materials as it is in isolating or dielectric material. In solid conductor bodies, because of its crystalline structure, the atoms can be ionized by losing one or more electrons, which electrons are defined as free electrons by the moving capacity thereof through the conductor and the direction of an electric force. However, there are no free electrons in the dielectric materials, so there are no charges capable of moving through materials. However, the atoms, and in a general way the molecules of any dielectric material, show a structure that can be defined as elastic because its balance is subject to deformations provoked by the action of electrical, or even mechanical efforts. Thus, it can be said that by the consequence of said deformation, the atoms or molecules can be polarized, and have, in this way, a positive pole and a negative pole. These features of the material, particularly the dielectric features may be used as a principle of the operation of an electrical field detector.

3. Summary of the Invention

It is therefore an object of the present invention to provide an electric field detector, capable of detecting any electric field magnitude and providing a quick visualization of the direction of the electric field.

It is even another object of the present invention to provide an electric field detector, preferably a manually operated detector, that can be taken into practice in a simple and economical way, and that has a simple construction and is made of common and low cost materials.

It is a further object of the present invention to provide an electric field detector comprising a non electrical conducting detector needle, having a rotation center rotatably mounted in a needle-supporting stand having a supporting pin, the pin and the needle being disposed in a box made of a non electrical conducting material, at least one portion of box defining an observation window to see said needle from outside the box.

The above and another objects, features and advantages of these invention would be better understood when taken in connection with the accompanying drawings and description.

BRIEF DESCRIPTION OF THE DRAWINGS

The present invention is illustrated by way of example in the following drawings wherein.

DESCRIPTION OF THE PREFERRED EMBODIMENTS

Figures 1, 2:
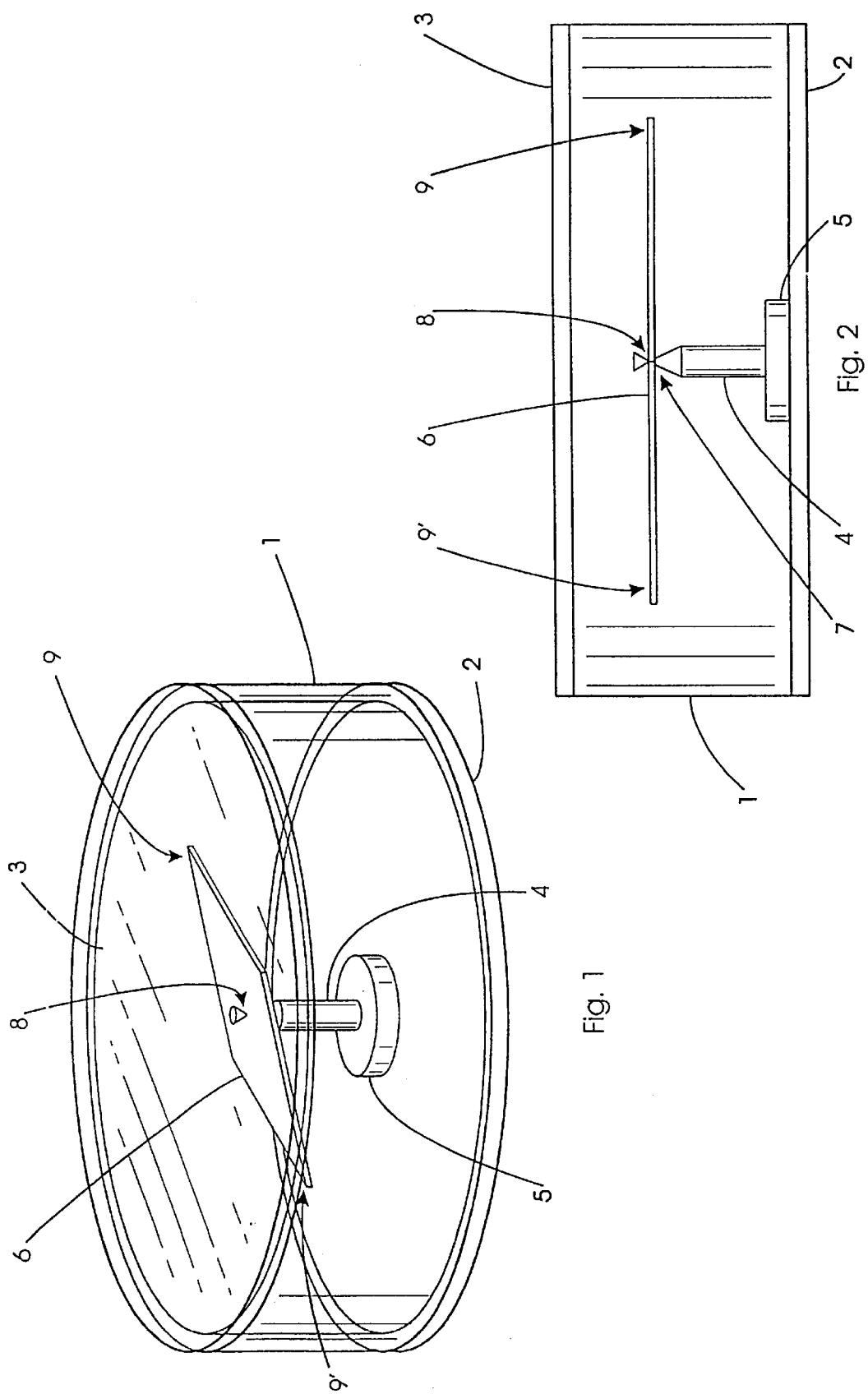
FIG. 1 shows a perspective view of the electrical field detector of the present invention.
FIG. 2 shows a side elevation view of the detector of FIG. 1.

Now referring in detail to the drawings it may be seen from FIGS. 1 and 2, a vessel 1, preferably a box of cylindrical shape and hermetically closed, the box having a bottom closed end that defines a base 2, and a top closed end closed by a tap 3, all made in a non electrical conducting material. Box 1 can be totally transparent or only the tap 3 may be transparent to define a window or observation portion of the detector during operation.

Box 1 includes a supporting stand defined by a pin 4 fixed at its bottom end 5 to base 2, and carrying, at an upper sharpened end, a detecting needle 6. Pin 4 can be made of any material, either metal or plastics, although it is preferably made of a non electrically conductive material.

As it is appreciated in FIG. 2, needle 6 has a rotation center 8 that is mounted to upper end 7 of pin 4, and center 8 is mounted in a way that it can freely oscillate under the presence of an electric field, and get aligned with the force line of the field.

Needle 6 is made of a non electrically conductive material, for example of an elongated sheet of paper or plastic material. Needle 6 is flat and defines a geometrically symmetrical surface related to rotation center 8, having opposite pointed tips or ends 9, 9'. These ends 9, 9' allow one to make use of the "point effect" to which reference has been made above.

Figure 3:
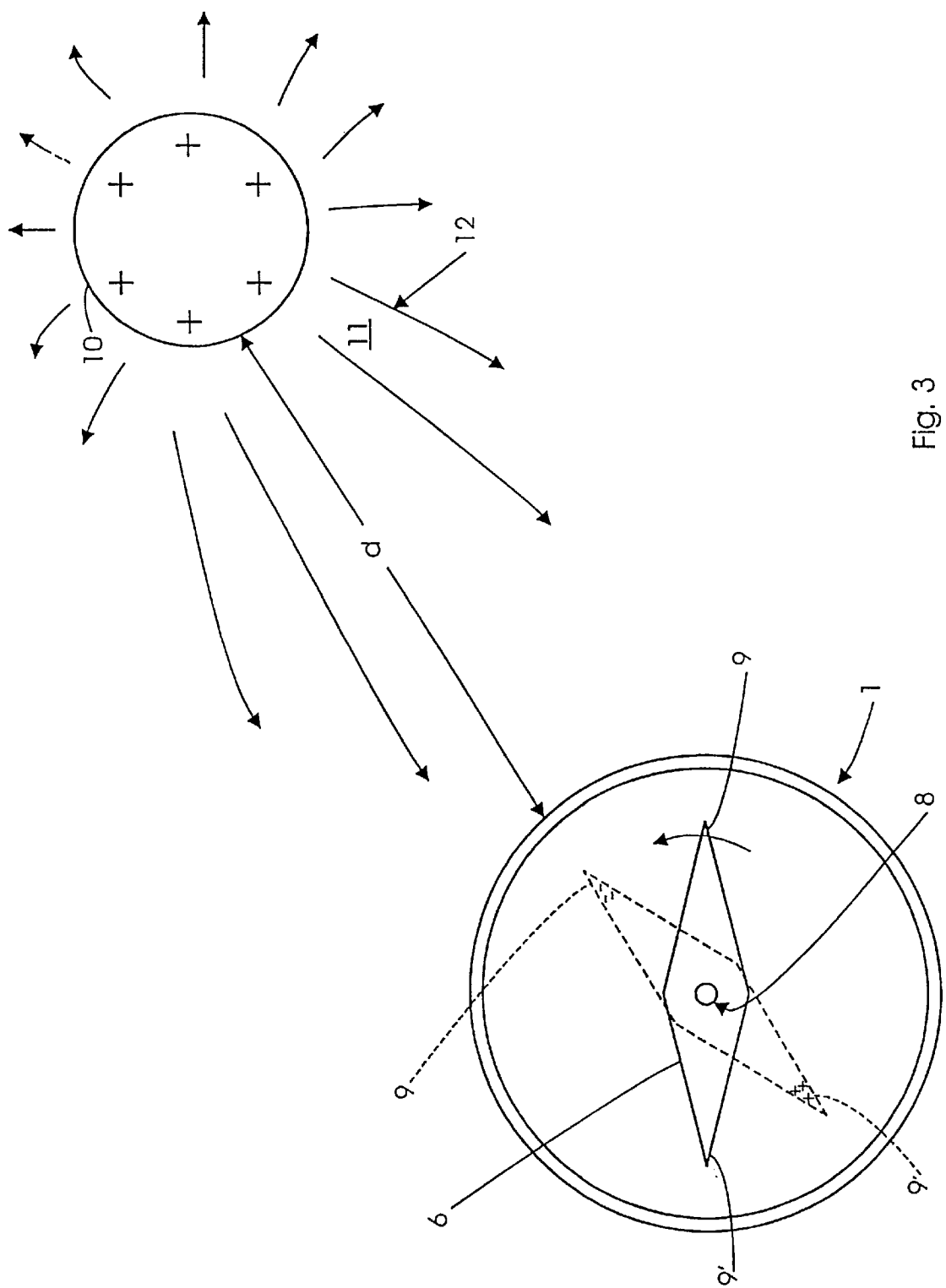
FIG. 3 shows a top plan view of the detector shown in FIGS. 1 and 2, where a charged body is also shown, having an electrical field that is detected by the detector of the present invention.

FIG. 3 shows the reaction of needle 6 under the presence of a body electrically charged 10 and, whose charges, in these case being positive, generate an electric field 11 whose forces lines are indicated with numeral reference 12. Said body 10 represents, in a generic way, any conductor or dielectric body, of any shape and size, and it is located at a distance "d" from the detector. Obviously, the greater the magnitude of the electrical charge of the body 10 is, and consequently greater the intensity of the generated electrical field 11, the greater would also be the distance "d" from which needle 6 will be able to detect the presence of said electric field 11.

In this FIG. 3 needle 6 has been illustrated in solid lines to represent the resting position of said needle when no electric field 11 is affecting the needle. Meanwhile, same needle 6 is illustrated in dashed lines to show the new adopted position when needle 6 detects the presence of electric field 11.

Upon the presence of body 10 with positive charges, force lines 12 of electrical field 11 generated by said charges pass through needle 6 and causes the needle to have a charge polarization at ends 9 and 9'. Since end 9 is closest to body 10, the electric field 11 of positive potential generates the concentration of negative forces in said end 9, therefore, the attraction forces between the positive forces of body 10 and the negative forces at end 9, make the needle 6 to turn around its rotation center until it is oriented towards body 10. In end 9', positive charges have been concentrated because of the effect of the repulsion forces between charges having the same sign.

It is to be kept in mind that this illustration is a simplification of the electrical charge polarization effect of the atoms or molecules of the material that needle 6 is made of.

Since needle 6 is made of a material having homogeneous dielectric characteristics all around the entire body of the needle, needle 6 is able to rotate in any direction until it becomes aligned with the detected electrical field 11, this only depending on which end 9 and 9' are initially near to body 10. Once the electric field has disappeared the polarized electric charges at ends 9 and 9' of needle 6 return to the initial state of balance when the needle 6 is no more affected by the action of the electrical forces that caused its displacement.

It must be kept in mind that box 1 must not be metallic, and the needle must not be made of iron or iron alloy in order to achieve a proper operation of the detector of the invention.

I claim:

1. An electrical compass to detect the presence of electrical fields, comprising a needle supporting stand having a supporting pin, one and only one electrically non-conductive detector needle and no other detector needle, the electrically non-conductive detector needle, having a rotation center rotatably mounted on the supporting pin of the needle-supporting stand, the supporting pin and the needle supporting stand being disposed in a box made of an electrically non-conductive material, at least one portion of the box defining an observation window to permit observation of said needle from outside the box.

2. A compass according to claim 1, wherein said pin has an upper pointed end to which the needle is mounted to permit free rotary movement.

3. A compass according to claim 1, wherein the needle has a flat shape and defines a geometrically symmetrical surface relative to said rotation center.

4. A compass according to claim 1, wherein the box has a cylindrical shape and defines a bottom end that forms a base for the pin, and an upper end closed by a tap made of transparent material, the tap defining said observation window, the box being hermetically closed.

5. A compass according to claim 1, wherein said needle is a sheet of paper.

6. A compass according to claim 1, wherein said needle is a plastic sheet.

7. A compass according to claim 1, wherein said needle defines opposite pointed ends.

8. A compass according to claim 1, wherein said pin is metallic.

9. A compass according to claim 1, wherein said pin is made of an electrically non-conductive material.

\* \* \* \* \*